United States Patent
Kim et al.

(10) Patent No.: US 7,892,919 B2
(45) Date of Patent: Feb. 22, 2011

(54) METHOD OF FORMING ISOLATION LAYER IN SEMICONDUCTOR DEVICE

(75) Inventors: Jung Geun Kim, Seoul (KR); Cheol Mo Jeong, Icheon-Si (KR); Whee Won Cho, Cheongju-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 147 days.

(21) Appl. No.: 12/163,328

(22) Filed: Jun. 27, 2008

(65) Prior Publication Data

US 2009/0098740 A1 Apr. 16, 2009

(30) Foreign Application Priority Data

Oct. 10, 2007 (KR) .................. 10-2007-0102159

(51) Int. Cl.
*H01L 21/8242* (2006.01)
(52) U.S. Cl. ...................................... 438/254
(58) Field of Classification Search ................. 438/264, 438/265
See application file for complete search history.

(56) References Cited

U.S. PATENT DOCUMENTS

| | | | |
|---|---|---|---|
| 5,872,058 A * | 2/1999 | Van Cleemput et al. ..... 438/692 |
| 7,256,091 B2 * | 8/2007 | Kim et al. .................. 438/264 |
| 7,332,408 B2 * | 2/2008 | Violette ..................... 438/435 |
| 7,465,680 B2 * | 12/2008 | Chen et al. ................. 438/788 |
| 2005/0142765 A1 * | 6/2005 | Joo ............................ 438/264 |
| 2005/0285179 A1 * | 12/2005 | Violette ..................... 257/315 |
| 2006/0150913 A1 * | 7/2006 | Wang et al. ............. 118/723 IR |
| 2007/0196997 A1 * | 8/2007 | Kim et al. .................. 438/424 |

FOREIGN PATENT DOCUMENTS

| KR | 1020060038620 | 5/2006 |
|---|---|---|
| KR | 1020070087373 | 8/2007 |

OTHER PUBLICATIONS

Bauer, Frank "Preparation of moisture curable polysilazane coatings Part I. Elucidation of low temperature curing kinetics by FT-IR spectroscopy" Progress in Organic Coatings 53 (2005) pp. 183-190.*

* cited by examiner

*Primary Examiner*—N Drew Richards
*Assistant Examiner*—Grant S Withers
(74) *Attorney, Agent, or Firm*—Marshall, Gerstein & Borun LLP

(57) ABSTRACT

The invention discloses a method of forming an isolation layer in a semiconductor device. The method includes providing a semiconductor substrate having a trench formed therein; forming a first insulating layer in the trench; and forming a densified second insulating layer on the first insulating layer. In the above method, a void is not generated in the isolation layer so a bending phenomenon of an active region can be reduced or prevented to improve an electrical characteristic of the semiconductor.

39 Claims, 4 Drawing Sheets

METHOD OF FORMING ISOLATION LAYER IN SEMICONDUCTOR DEVICE

CROSS-REFERENCE TO RELATED APPLICATIONS

Priority to Korean Patent Application No. 10-2007-0102159, filed on Oct. 10, 2007, the disclosure of which is incorporated herein by reference in its entirety, is claimed.

BACKGROUND OF THE INVENTION

The invention relates to a method of forming an isolation layer in a semiconductor device, and more particularly to a method of forming an isolation layer in a semiconductor device, which can reduce or prevent a bent phenomenon of an active region caused by a compressive stress exerted on an isolation layer.

As the integration of a semiconductor device is increased, a smaller pattern is formed, and widths of an active region and an isolation region become narrowed due to the smaller pattern.

In particular, the narrower the width of a trench formed in the isolation region, the more the aspect ratio is increased, which can make it difficult to perform a gap-fill process to form an insulating layer (for example, a high density plasma (HDP) layer). To improve the gap-fill characteristic, a technique for forming a spin-on-dielectric (SOD) layer has been developed. The conventional HDP layer has a low step coverage characteristic. The aspect ratio of the trench is increased so that an upper portion of the trench is covered with the HDP layer, while a lower portion of the trench is not filled completely. As a result, a void can be generated in the isolation layer. Due to such a void, etchant can penetrate easily into the isolation layer during a subsequent etching process, causing a defect of the isolation layer. In order to solve the above-described problem, a lower portion of the trench is filled with the SOD layer to reduce an aspect ratio. The isolation layer can be then formed of the HDP layer. The SOD layer is formed in the liquid state, and a heat treatment process is performed to oxidize and densify the SOD layer prior to forming the HDP layer.

Although the SOD layer is densified through the heat treatment process, the SOD layer has a high etching selection ratio in a range of six (6) times to ten (10) times higher than that of the conventional HDP layer. Accordingly, when an etching process is performed after forming a subsequent HDP layer, etchant can penetrate into the SOD layer.

Referring to FIG. 1A and FIG. 1B, etchant can penetrate into the SOD layer via the HDP layer to generate a void in the isolation layer. If the void is generated in the isolation layer, a strength unbalance between a region of the isolation layer in which the void is generated and another region of the isolation layer in which no void is generated can cause the active region to bend. The bent active region causes a layer formed on an upper portion of the active region to become unstable, and an electrical characteristic of the semiconductor device can be deteriorated.

SUMMARY OF THE INVENTION

An objective of the invention is to provide a method of forming an isolation layer in a semiconductor device, having one or more benefits such as preventing etchant from penetrating into a SOD layer during a subsequent etching process.

A method of forming an isolation layer in a semiconductor device according to one embodiment of the invention includes providing a semiconductor substrate having a trench formed therein; forming a first insulating layer in the trench; and forming a densified second insulating layer on the first insulating layer.

A method of forming an isolation layer in a semiconductor device according to another embodiment of the invention includes sequentially forming a tunnel insulating layer, a conductive layer, and an isolation mask pattern on a semiconductor substrate; patterning the conductive layer and the tunnel insulating layer using the isolation mask pattern as a mask; removing a portion of the semiconductor substrate to form a trench; forming a first insulating layer in the trench; and forming a densified second insulating layer on the first insulating layer.

The first insulating layer can be formed, for example, as a SOD layer, and the SOD layer can be formed, for example, from perhydropolysilazane (PSZ).

The method of forming an isolation layer in a semiconductor device according to an embodiment of the invention can further include performing a densifying process after SOD layer is formed. Preferably, the densifying process is a heat treatment. The heat treatment is preferably performed under an atmosphere of $H_2O$ or $O_2$ gas.

Preferably, the second insulating layer is formed of a HDP layer, and the HDP layer is, preferably, formed using mono silane ($SiH_4$) gas, oxygen ($O_2$) gas, and helium (He) gas.

Mono silane gas is preferably supplied at a flow rate in a range of 40 to 70 sccm (standard cubic centimeter per minute). The oxygen gas is preferably supplied at a flow rate in a range of 120 to 300 sccm. The helium gas is preferably supplied at a flow rate in a range of 150 to 250 sccm.

The HDP layer is preferably formed by applying a top power in a range of 8 to 12 kW. The HDP layer is preferable formed by applying a side power in a range of 6 to 10 kW. In addition or in the alternative, the HDP layer is, preferably, formed by applying a low frequency (LF) in a range of 4 to 5 KHz, and the HDP layer is formed in a chamber in which an inner pressure is adjusted to a value in a range of 3 to 5 Torr. As a result, the second insulating layer has a compressive strength in a range of $-5 \times 10^9$ $dyn/cm^2$ to $-10 \times 10^9$ $dyn/cm^2$.

In one embodiment, the method of the invention can further include performing an etching process to enlarge a width of an upper portion of the trench after the second insulating layer is formed. A third insulating layer can then be formed on the second insulating layer. Preferably, the third insulating layer is formed as a HDP layer.

The HDP layer is, preferably, formed using mono silane ($SiH_4$) gas, oxygen ($O_2$) gas, and helium (He) gas. The mono silane gas is, preferably, supplied at a flow rate in a range of 40 to 70 sccm, the oxygen gas is, preferably, supplied at a flow rate in a range of 120 to 300 sccm, and helium gas is, preferably, supplied at a flow rate in a range of 150 to 250 sccm.

Preferably, the HDP layer is formed by applying a top power in a range of 8 to 12 kW. Preferably, the HDP layer is formed by applying a side power in a range of 6 to 10 kW. Preferably, the HDP layer is formed by applying a low frequency (LF) in a range of 4 to 5 KHz. In addition, an inner pressure of a chamber, in which the HDP layer is formed, is, preferably, adjusted to a value in a range of 3 to 5 Torr.

The method of the invention can further include forming a liner insulating layer along walls of the trench before forming the first insulating layer. The liner insulating layer is preferably formed of an oxide.

A method of forming an isolation layer in a semiconductor device according to another embodiment of the invention includes providing a semiconductor substrate having a trench formed therein; forming a first insulating layer in the trench; and forming a second insulating layer on the first insulating layer by applying a top power in a range of 8 to 12 kW.

BRIEF DESCRIPTION OF THE DRAWINGS

The above and other features and advantages of the invention will become readily apparent by reference to the following detailed description when considered in conjunction with the accompanying drawings, wherein.

DESCRIPTION OF SPECIFIC EMBODIMENTS

Hereinafter, the preferred embodiments of the invention will be explained in more detail with reference to the accompanying drawings. However, it should be understood that the invention is not limited to the embodiments described below and the embodiment of the invention can be variously modified.

FIG. 2A to FIG. 2E are sectional views of a semiconductor device for illustrating a method of forming an isolation layer 216 in a semiconductor device according to the invention.

Figure 1A:
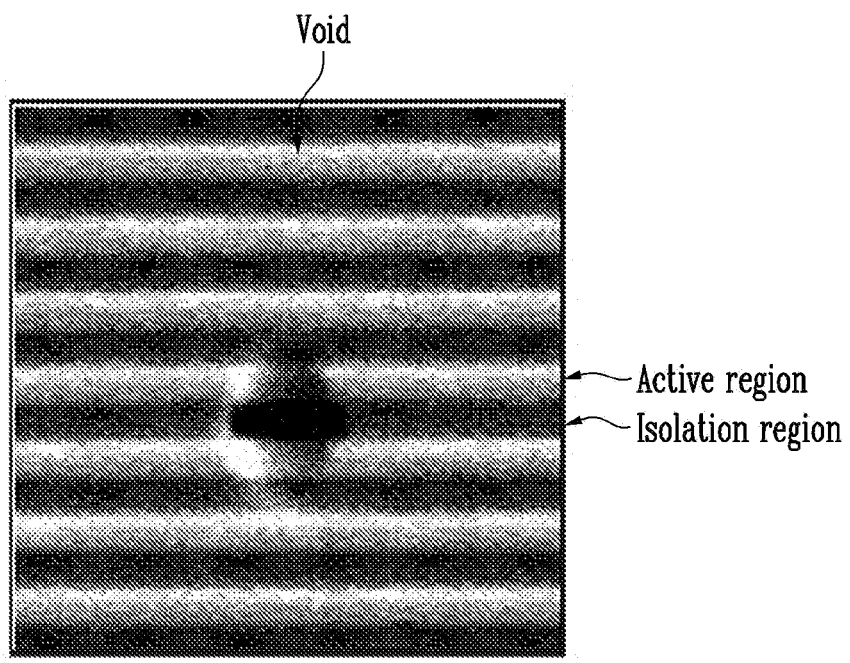
FIG. 1A and FIG. 1B are annotated photographs for illustrating a semiconductor device according to a conventional art.
Figure 1B:
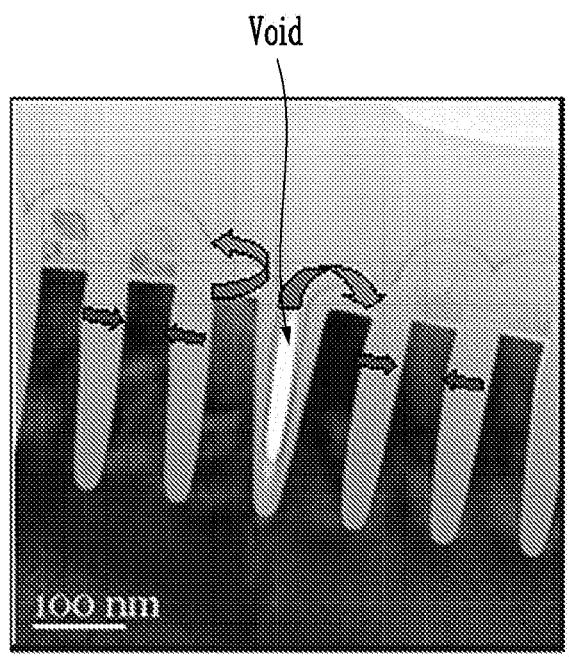
Figure 2A:
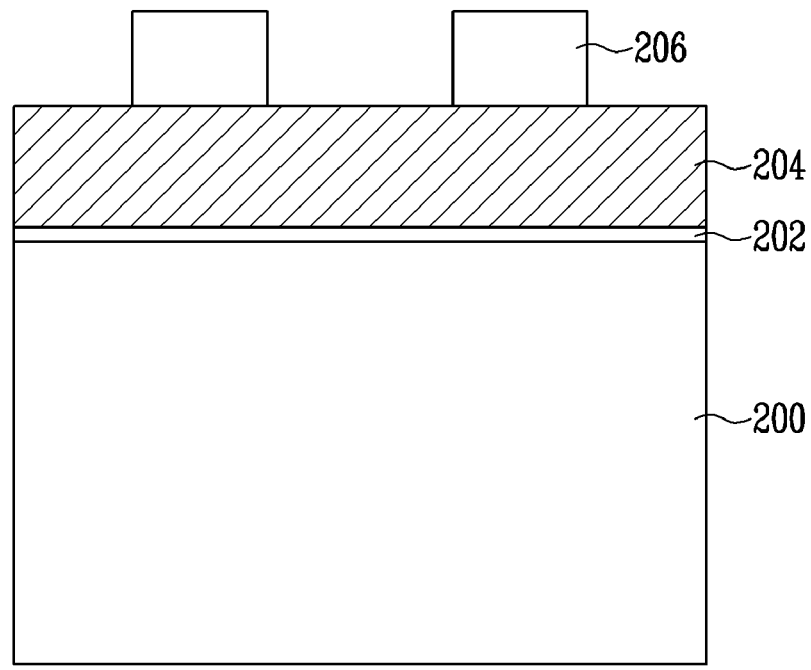
FIG. 2A to FIG. 2E are sectional views of a semiconductor device for illustrating a method of forming an isolation layer in a semiconductor device according to the invention.

Referring to FIG. 2A, in a flash memory device, for example, a tunnel insulating layer 202 (or a gate insulating layer), a conductive layer 204 for a floating gate, and an isolation mask pattern 206 are sequentially formed on a semiconductor substrate 200. The tunnel insulating layer 202 can be formed, for example, from an oxide, and the conductive layer 204 can be formed, for example, from polysilicon. The isolation mask pattern 206 is formed in a shape such that an isolation region is exposed, and can be formed, for example, from a nitride.

Figure 2B:
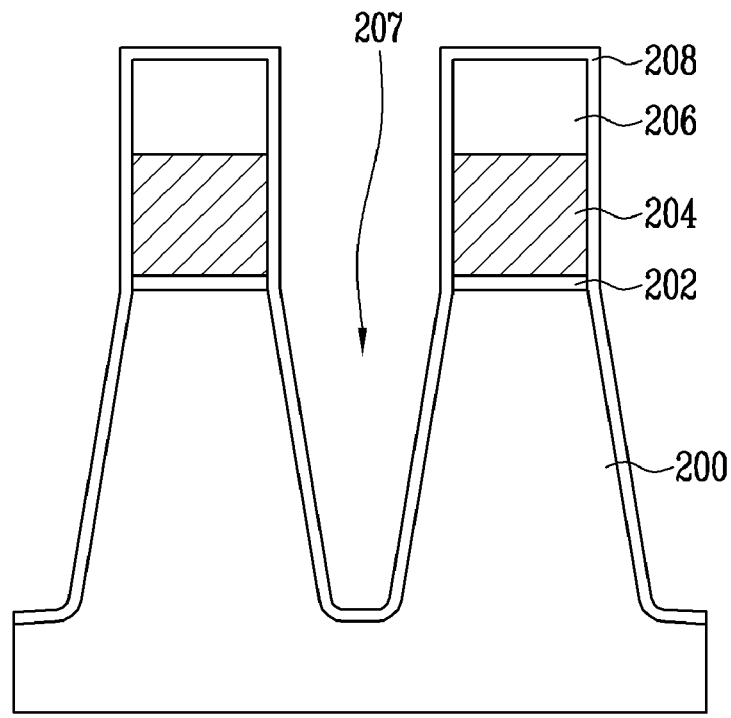

Referring to FIG. 2B, an etching process is performed using the isolation mask pattern 206 as a mask to sequentially pattern the conductive layer 204 and the tunnel insulating layer 202, thereby exposing a portion of the semiconductor substrate 200. At least a portion of the exposed region of the semiconductor substrate 200 is removed to form a trench 207. Subsequently, a liner insulating layer 208 can be formed along one or more walls of the trench 207, the tunnel insulating layer 202, the conductive layer 204, and the isolation mask pattern 206. The liner insulating layer 208 can be formed, for example, from an oxide. In addition, prior to forming the liner insulating layer 208, a wall insulating layer (not shown) can be formed along a surface of the trench 207 on at least the semiconductor substrate 200 to compensate for etching damage of the semiconductor substrate 200.

Figure 2C:
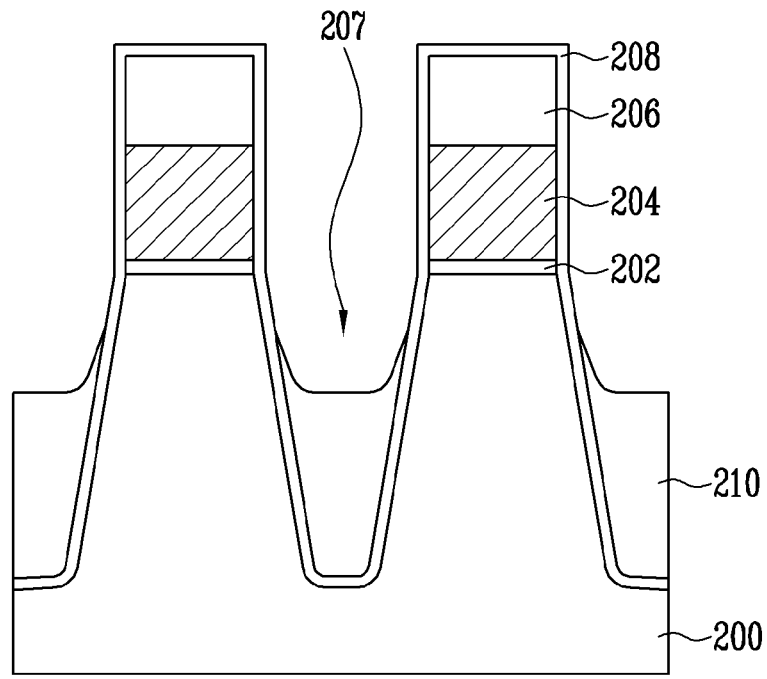

Referring to FIG. 2C, a first insulating layer 210 is formed on a bottom surface of the trench 207 to enhance a gap-fill characteristic. The first insulating layer 210 can be formed, for example, as a SOD layer, which can make it easier to fill the trench 207 with the first insulating layer 210. Physically, SOD is a material that is formed a liquid state, and is developed to improve a gap-fill characteristic according to an increase of the integrity of the semiconductor device. For example, the SOD layer can be formed from perhydro-polysilazane (PSZ). The SOD layer is formed in a liquid state, and a densifying process is performed after forming the SOD layer to densify the SOD layer. The densifying process can be a heat treatment, for example. The densifying process is illustrated with reference to the following reaction formula.

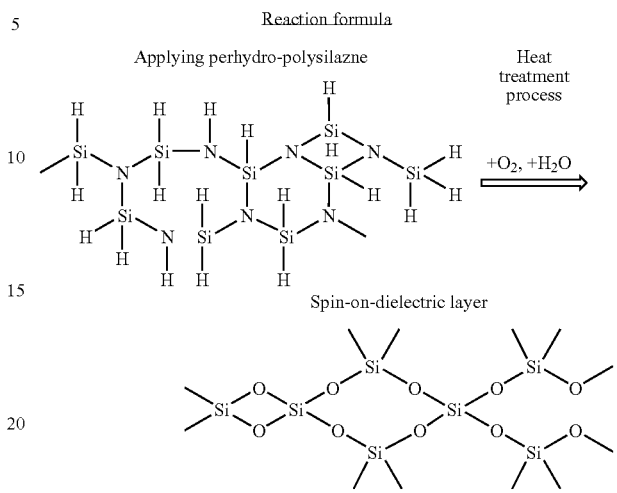

Referring to the above reaction formula, PSZ consists of silicon (Si), hydrogen (H), and nitrogen (N). After the PSZ layer is formed in a liquid state, a heat treatment process is performed under an atmosphere of $H_2O$ or $O_2$ gas to densify the PSZ layer. As a result, nitrogen ($N_2$), ammonia ($NH_3$), nitride oxide (NO), and a by-product are generated and are discharged in a gaseous state and removed. The first insulating layer 210 is preferably formed of a solidified SOD layer consisting of silicon dioxide ($Si_2O$). However, the SOD layer is extremely vulnerable to etchant. For example, the SOD layer has an etching selection ratio against wet etchant in a range of six (6) times to ten (10) times higher than that of a HDP layer.

Figure 2D:
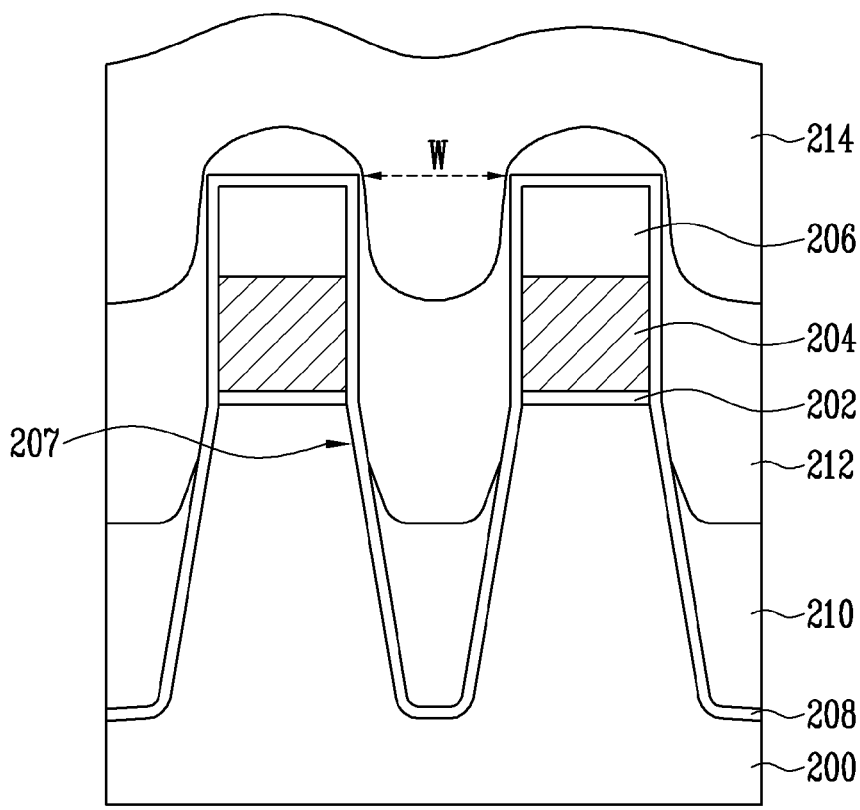

Referring to FIG. 2D, the trench 207 in which the first insulating layer 210 is formed is filled with a second insulating layer 212. Preferably, the second insulating layer 212 is formed as a HDP layer. To prevent the first insulating layer 210 from being damaged by penetration of an etchant during a subsequent wet etching process, the second insulating layer 212 is densified (or has a high compressibility). To obtain the second insulating layer 212 as described above, the second insulating layer 212 is preferably formed under the following conditions: The second insulating layer 212 is, preferably, formed using mono silane ($SiH_4$) gas, oxygen ($O_2$) gas, and helium (He) gas. Preferably, mono silane gas is supplied at a flow rate in a range of 40 to 70 sccm (standard cubic centimeter per minute), oxygen gas is supplied at a flow rate in a range of 120 to 300 sccm, and helium gas is supplied at a flow rate in a range of 150 to 250 sccm. In addition, it is preferable that a top power in a range of 8 to 12 kW is applied and a side power in a range of 6 to 10 kW is applied. It is preferable that a low frequency (LF) in a range of 4 to 5 KHz 12 is applied, and an inner pressure of a chamber, in which the HDP layer is formed, is adjusted to a value in a range of 3 to 5 Torr. An HDP layer formed under the above conditions can be densified to enhance its compressive strength. For example, a second insulating layer 212 having a high compressive strength of $-5 \times 10^9$ $dyn/cm^2$ to $-10 \times 10^9$ $dyn/cm^2$ can be formed.

By densifying the second insulating layer 212, it is possible to prevent etchant, used in a subsequent process, from infiltrating into and damaging the first insulating layer 210.

As integration of the semiconductor is increased, an aspect ratio of the trench 207 is increased so that a gap-fill characteristic can be lowered. Accordingly, after the densified second insulating layer 212 is formed, an etching process for enlarging a width W of an upper portion of the trench 207 can be performed to remove at least a portion of the second insulating layer 212 formed on an active region. Subsequently, a third insulating layer 214 is formed on the second insulating layer 212 to fill the trench 207. In order to completely fill the trench 207 with an insulating layer, it is preferable that the third insulating layer 214 is formed to entirely cover the second insulating layer 212.

The third insulating layer 214 can be formed, for example, of a HDP layer. In addition, to prevent etchant used in a subsequent process from penetrating into the third insulating layer 214, it is preferable to form the third insulating layer 214 under the condition that mono silane gas is supplied at a flow rate in a range of 40 to 70 sccm, oxygen gas is supplied at a flow rate in a range of 120 to 300 sccm, and helium gas is supplied at a flow rate in a range of 150 to 250 sccm. In addition, a top power in a range of 8 to 12 kW is preferably applied and a side power in a range of 6 to 10 kW is preferably applied. It is also preferable that a low frequency (LF) of 4 to 5 KHz 12 is applied, and an inner pressure of a chamber, in which the third insulating layer 214 is formed, is adjusted to a value in a range of 3 to 5 Torr. Using the above condition can increase the strength of the third insulating layer 214.

Figure 2E:
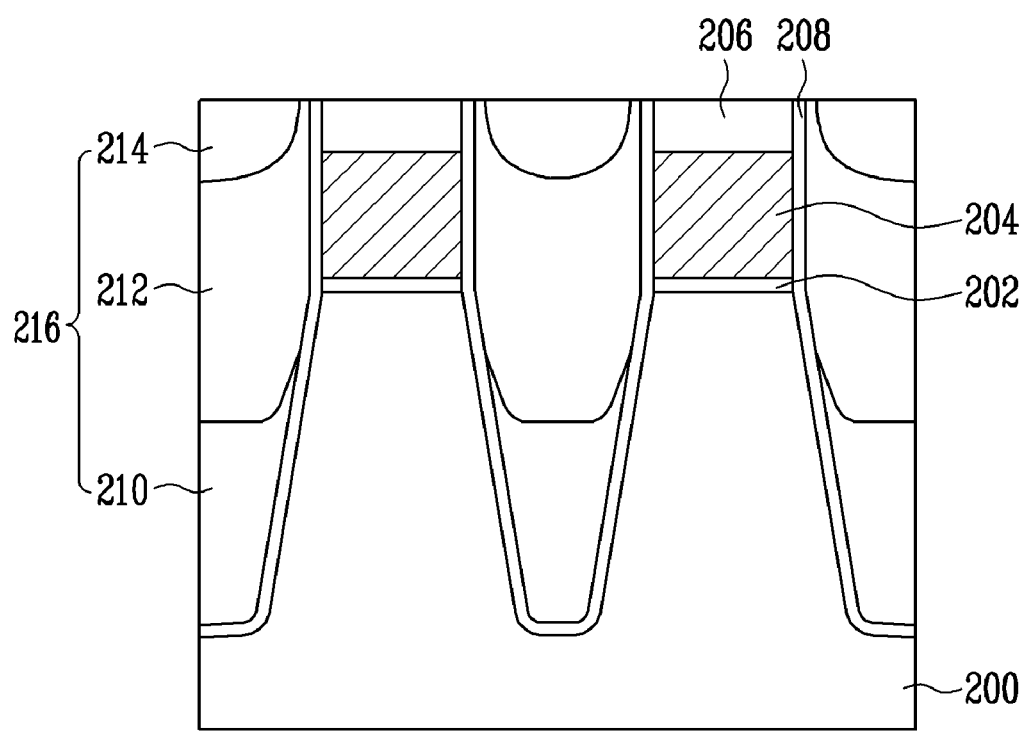

Referring to FIG. 2E, a planarization process is performed to expose the isolation mask pattern 206. For example, a chemical mechanical polishing (CMP) process can be performed. The first insulating layer 210, the second insulating layer 212, and the third insulating layer 214 are isolated by the isolation mask pattern 206 to form an isolation layer 216.

The strengths of the second insulating layer 212 and the third insulating layer 214 of the isolation layer 216 are enhanced by the above-described method to inhibit etchant from penetrating into the first insulating layer 210 during a subsequent etching process. By preventing damage of the first insulating layer 210, generation of a void in the trench 207 can be reduced or prevented. Accordingly, bending of the active region can be reduced or prevented, and deterioration of an electrical characteristic of the semiconductor device can be inhibited or prevented.

Preferably, after the SOD layer is formed on a bottom surface of the trench 207, the densified insulating layer is formed on the SOD layer to prevent etchant from penetrating into the SOD layer during a subsequent etching process. Due to the above-described advantage, generation of a void in the isolation layer 216 can be reduced or prevented so that portions of the isolation layer 216 can have uniform strength, which can reduce or prevent bending of the active region, and improve an electrical characteristic of the semiconductor device.

Although embodiments have been described with reference to a number of illustrative embodiments, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of forming an isolation layer in a semiconductor device, the method comprising:

providing a semiconductor substrate having a trench formed therein;

forming a first insulating layer in the trench, wherein the first insulating layer is a perhydro-polysilazane layer;

forming a densified second insulating layer on the first insulating layer, wherein the densified second insulating layer is a high density plasma layer; and performing an etching process to enlarge the width of an upper portion of the trench after forming the densified second insulating layer.

2. The method of claim 1, further comprising densifying the perhydro-polysilazane layer.

3. The method of claim 2, further comprising densifying the perhydro-polysilazane layer by heat treatment.

4. The method of claim 3, further comprising performing the heat treatment under an atmosphere of $H_2O$ or $O_2$ gas.

5. The method of claim 1, further comprising forming the high density plasma layer using mono silane gas, oxygen gas, and helium gas.

6. The method of claim 5, further comprising forming the high density plasma layer by supplying the mono silane gas at a flow rate in a range of 40 to 70 sccm (standard cubic centimeter per minute), supplying the oxygen gas at a flow rate in a range of 120 to 300 sccm, and supplying the helium gas at a flow rate in a range of 150 to 250 sccm.

7. The method of claim 1, further comprising forming the high density plasma layer by applying a top power in a range of 8 to 12 kW and a side power in a range of 6 to 10 kW.

8. The method of claim 1, further comprising forming the high density plasma layer by applying a low frequency in a range of 4 to 5 kHz.

9. The method of claim 1, further comprising forming the high density plasma layer in a chamber in which an inner pressure is adjusted to a value in a range of 3 to 5 Torr.

10. The method of claim 1, comprising forming the densified second insulating layer with a compressive strength of $-5 \times 10^9$ $dyn/cm^2$ to $-10 \times 10^9$ $dyn/cm^2$.

11. The method of claim 1, further comprising forming a third insulating layer on the second insulating layer.

12. The method of claim 11, further comprising forming the third insulating layer as a high density plasma layer.

13. The method of claim 12, further comprising forming the high density plasma layer using mono silane gas, oxygen gas, and helium gas.

14. The method of claim 13, further comprising forming the high density plasma layer by supplying the mono silane gas at a flow rate in range of 40 to 70 sccm, supplying the oxygen gas at a flow rate in a range of 120 to 300 sccm, and supplying helium gas at a flow rate in a range of 150 to 250 sccm.

15. The method of claim 12, further comprising forming the high density plasma layer by applying a top power in a range of 8 to 12 kW and a side power in a range of 6 to 10 kW.

16. The method of claim 12, further comprising forming the high density plasma layer by applying a low frequency in a range of 4 to 5 kHz.

17. The method of claim 12, further comprising forming the high density plasma layer in a chamber in which an inner pressure is adjusted to a value in a range of 3 to 5 Torr.

18. The method of claim 1, further comprising forming a liner insulating layer along walls of the trench before forming the first insulating layer.

19. The method of claim 18, further comprising forming the liner insulating layer from an oxide.

20. A method of forming an isolation layer in a semiconductor device, the method comprising:

sequentially forming a tunnel insulating layer, a conductive layer, and an isolation mask pattern on a semiconductor substrate;

patterning the conductive layer and the tunnel insulating layer using the isolation mask pattern as a mask;

removing a portion of the semiconductor substrate to form a trench;

forming a first insulating layer in the trench, wherein the first insulating layer is a spin-on-dielectric layer;

forming a densified second insulating layer on the first insulating layer, wherein the densified second insulating layer is a high density plasma layer;

etching a portion of the densified second insulating layer to enlarge the width of an upper portion of the trench after forming the second insulating layer; and forming a third insulating layer on the second insulating layer.

21. The method of claim 20, further comprising forming the spin-on-dielectric layer from perhydro-polysilazane.

22. The method of claim 21, further comprising densifying the perhydro-polysilazane layer.

23. The method of claim 22, further comprising densifying the spin-on-dielectric by heat treatment.

24. The method of claim 23, further comprising performing the heat treatment under an atmosphere of $H_2O$ or $O_2$ gas.

25. The method of claim 20, further comprising forming the high density plasma layer using mono silane gas, oxygen gas, and helium gas.

26. The method of claim 25, further comprising forming the high density plasma layer by supplying the mono silane gas at a flow rate in the range of 40 to 70 sccm (standard cubic centimeter per minute), supplying the oxygen gas is supplied at a flow rate in a range of 120 to 300 sccm, and supplying helium gas at a flow rate in a range of 150 to 250 sccm.

27. The method of claim 20, further comprising forming the high density plasma layer by applying a top power in a range of 8 to 12 kW and a side power in a range of 6 to 10 kW.

28. The method of claim 20, further comprising forming the high density plasma layer by applying a low frequency in a range of 4 to 5 kHz.

29. The method of claim 20, further comprising forming the high density plasma layer in a chamber in which an inner pressure is adjusted to a value in a range of 3 to 5 Torr.

30. The method of claim 20, comprising forming the densified second insulating layer with a compressive strength of $-5\times10^9$ dyn/cm$^2$ to $-10\times10^9$ dyn/cm$^2$.

31. The method of claim 20, further comprising forming the third insulating layer as a high density plasma layer.

32. The method of claim 31, further comprising forming the high density plasma layer using mono silane gas, oxygen gas, and helium gas.

33. The method of claim 32, further comprising forming the high density plasma layer by supplying the mono silane gas at a flow rate in a range of 40 to 70 sccm, supplying the oxygen gas at a flow rate in a range of 120 to 300 sccm, and supplying helium gas at a flow rate in a range of 150 to 250 sccm.

34. The method of claim 31, further comprising forming the third insulating layer by applying a top power in a range of 8 to 12 kW and a side power in a range of 6 to 10 kW.

35. The method of claim 31, further comprising forming the third insulating layer by applying a low frequency in a range of 4 to 5 kHz.

36. The method claim 31, further comprising forming the third insulating layer in a chamber in which an inner pressure is adjusted to a valve in a range of 3 to 5 Torr.

37. The method of claim 20, further comprising forming a liner insulating layer along walls of the trench, the tunnel insulating layer, the conductive layer, and the isolation mask pattern before forming the first insulating layer.

38. The method of claim 37, further comprising forming the liner insulating layer from an oxide.

39. A method of forming an isolation layer in a semiconductor device, of the method comprising:

providing a semiconductor substrate having a trench formed therein;

forming a perhydro-polysilazane layer in the trench; and forming a high density plasma layer on the first insulating layer by supplying a mono silane gas at a flow rate in a range of 40 to 70 sccm, supplying an oxygen gas at a flow rate in a range of 120 to 300 sccm, and supplying a helium gas at a flow rate in a range of 150 to 250 sccm to enhance a compressive strength of the high density plasma layer.

* * * * *